(12) United States Patent
Vuillermet et al.

(10) Patent No.: US 11,656,250 B2
(45) Date of Patent: May 23, 2023

(54) CURRENT SENSOR SYSTEM

(71) Applicant: Allegro MicroSystems, LLC, Manchester, NH (US)

(72) Inventors: Yannick Vuillermet, Voglans (FR); Loïc André Messier, Chene-en-Semine (FR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 17/467,713

(22) Filed: Sep. 7, 2021

(65) Prior Publication Data
US 2023/0071087 A1   Mar. 9, 2023

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .......................... G01R 15/207; G01R 19/0092
See application file for complete search history.

(56) References Cited

U.S. PATENT DOCUMENTS

| | | | |
|---|---|---|---|
| 4,757,420 A | 7/1988 | Saletta et al. | |
| 5,041,780 A * | 8/1991 | Rippel | G01R 15/207 324/251 |
| 6,300,617 B1 | 10/2001 | Daughton et al. | |
| 6,512,359 B1 | 1/2003 | Tamai et al. | |
| 6,583,613 B1 | 6/2003 | Hohe et al. | |
| 7,476,816 B2 | 1/2009 | Doogue et al. | |
| 7,746,056 B2 | 6/2010 | Stauth et al. | |
| 7,816,905 B2 | 10/2010 | Doogue et al. | |
| 7,923,996 B2 | 4/2011 | Doogue et al. | |
| 7,936,164 B2 | 5/2011 | Doogue et al. | |
| 8,030,918 B2 | 10/2011 | Doogue et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,818,749 B2 | 8/2014 | Friedrich et al. | |

(Continued)

FOREIGN PATENT DOCUMENTS

| | | |
|---|---|---|
| CN | 112649645 A | 4/2021 |
| GB | 2547732 | 8/2017 |
| WO | WO 2017/144715 A1 | 8/2017 |

OTHER PUBLICATIONS

U.S. Appl. No. 17/651,080, filed Feb. 15, 2022, Rock, et al.
U.S. Appl. No. 17/695,193, filed Mar. 15, 2022, Messier, et al.
Allegro MicroSystems Datasheet "Busbar Geometry and Design Techniques for Coreless Acs37610 Differential Current Sensor", Jan. 6, 2021, 11 pages.

(Continued)

*Primary Examiner* — Dominic E Hawkins
(74) *Attorney, Agent, or Firm* — Daly, Crowley, Mofford & Durkee, LLP

(57) ABSTRACT

A current sensor system, includes: a plurality of conductors that are integrated into a substrate, each of the plurality of conductors having a respective first through-hole formed therein and a plurality of current sensors, each of the plurality of current sensors being disposed on the substrate. Each of the plurality of current sensors is disposed above or below the respective first through-hole of a different one of the plurality of conductors, and the substrate includes a plurality of conductive traces, each coupled to at least one of the plurality of current sensors.

20 Claims, 14 Drawing Sheets

(56) References Cited

U.S. PATENT DOCUMENTS

| | | |
|---|---|---|
| 8,896,295 B2 | 11/2014 | Friedrich et al. |
| 8,907,669 B2 | 12/2014 | Petrie |
| 9,081,041 B2 | 7/2015 | Friedrich et al. |
| 9,151,807 B2 | 10/2015 | Friedrich et al. |
| 9,201,122 B2 | 12/2015 | Cesaretti et al. |
| 10,481,181 B2 | 11/2019 | Bussing et al. |
| 10,761,120 B2 | 9/2020 | Feucht et al. |
| 10,884,031 B2 | 1/2021 | Vuillermet et al. |
| 10,908,190 B2 | 2/2021 | Bussing et al. |
| 11,226,382 B2 | 1/2022 | Augendre et al. |
| 11,395,402 B2 * | 7/2022 | Sutono .................. H01P 3/081 |
| 2007/0279053 A1 | 12/2007 | Taylor et al. |
| 2008/0231255 A1 | 9/2008 | Lepine et al. |
| 2009/0121704 A1 | 5/2009 | Shibara |
| 2011/0270553 A1 | 11/2011 | Ausserlechner et al. |
| 2012/0001617 A1 | 1/2012 | Reynolds |
| 2012/0112365 A1 | 5/2012 | Ausserlechner et al. |
| 2012/0146164 A1 | 6/2012 | Ausserlechner |
| 2012/0253726 A1 | 10/2012 | Xu |
| 2013/0015843 A1 | 1/2013 | Doogue et al. |
| 2013/0335076 A1 | 12/2013 | Sakamoto et al. |
| 2014/0266181 A1 | 9/2014 | Milano et al. |
| 2014/0312883 A1 | 10/2014 | Friedrich et al. |
| 2015/0204916 A1 | 7/2015 | Akimoto et al. |
| 2015/0301149 A1 | 10/2015 | Cesaretti et al. |
| 2015/0331079 A1 | 11/2015 | Kolwalker et al. |
| 2015/0338444 A1 | 11/2015 | Ivanov et al. |
| 2015/0362532 A1 | 12/2015 | Chartouni |
| 2016/0011239 A1 | 1/2016 | Yoon et al. |
| 2016/0274060 A1 | 9/2016 | Deneneberg et al. |
| 2016/0282388 A1 | 9/2016 | Milano et al. |
| 2017/0131329 A1 * | 5/2017 | Gorai .................. G01R 15/207 |
| 2017/0242058 A1 * | 8/2017 | Kawanami ........... G01R 15/207 |
| 2017/0285075 A1 | 10/2017 | Okuyama et al. |
| 2018/0031613 A1 | 2/2018 | Nakayama |
| 2018/0180649 A1 | 6/2018 | Paci et al. |
| 2018/0238938 A1 | 8/2018 | Feucht et al. |
| 2018/0321283 A1 | 11/2018 | Sei et al. |
| 2019/0187187 A1 * | 6/2019 | Umetsu .................. G01R 1/04 |
| 2019/0212372 A1 * | 7/2019 | Bilbao De Mendizabal ............... G01R 33/09 |
| 2019/0391185 A1 | 12/2019 | El Bacha et al. |
| 2020/0011902 A1 * | 1/2020 | Shimizu ............. G01R 19/0092 |
| 2020/0057097 A1 | 2/2020 | Vuillermet et al. |
| 2020/0057120 A1 | 2/2020 | Belin et al. |
| 2020/0132725 A1 * | 4/2020 | Krummenacher ..... G01R 15/20 |
| 2021/0080489 A1 | 3/2021 | Koizumi |

OTHER PUBLICATIONS

U.S. Appl. No. 17/083,487, filed Oct. 29, 2021, Briano, et al.
U.S. Appl. No. 17/189,480, filed Mar. 2, 2021, Friedrich, et al.
Melexis Inspired Engineering; "Current Sensors Reference Design Guide"; Aug. 2016; 27 Pages.
Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.
Auto Innovations "L'évolution du moteur électrique passe par une meilleure mesure de la position de son rotor", Oct. 2019, 7 pages.
Extended European Search Report dated Jul. 10, 2018 for EP Application No. 18154879.3; 10 Pages.
Response filed on Feb. 22, 2019 for European Application No. 18154879.3; 20 Pages.
Intention to Grant dated Jun. 7, 2019 for European Application No. 18154879.3; 7 Pages.
Office Action dated Sep. 24, 2019 for U.S. Appl. No. 15/435,725; 25 pages.
Response to Office Action filed on Oct. 18, 2019 for U.S. Appl. No. 15/435,725; 13 pages.
Final Office Action dated Jan. 24, 2020 for U.S. Appl. No. 15/435,725; 25 pages.
Response to Final Office Action and Request for Continued Examination (RCE) filed on Mar. 31, 2020 for U.S. Appl. No. 15/435,725; 14 pages.
Notice of Allowance dated Jun. 9, 2020 for U.S. Appl. No. 15/435,725; 8 pages.
Office Action dated Jul. 6, 2020 for U.S. Appl. No. 15/999,122; 18 pages.
Office Action dated May 11, 2021 for U.S. Appl. No. 16/841,853; 18 pages.
Response to Office Action filed on Jul. 28, 2021 for U.S. Appl. No. 16/841,853, 12 pages.
Notice of Allowance dated Oct. 28, 2021 for U.S. Appl. No. 16/841,853, 9 pages.
PCT Search Report and Written Opinion dated Oct. 31, 2022 for PCT Application No. PCT/US2022/038329; 12 pages.
Infineon Datasheet, "TLE4972-AE35D5 high precision coreless current sensor for automotive applications", Dec. 21, 2021, 20 pages.
Infineon Datasheet, "TLE4972-AE35S5 high precision coreless current sensor for automotive applications", Dec. 21, 2021, 20 pages.
U.S. Office Action dated Dec. 6, 2022 for U.S. Appl. No. 17/651,080, 18 pages.

* cited by examiner

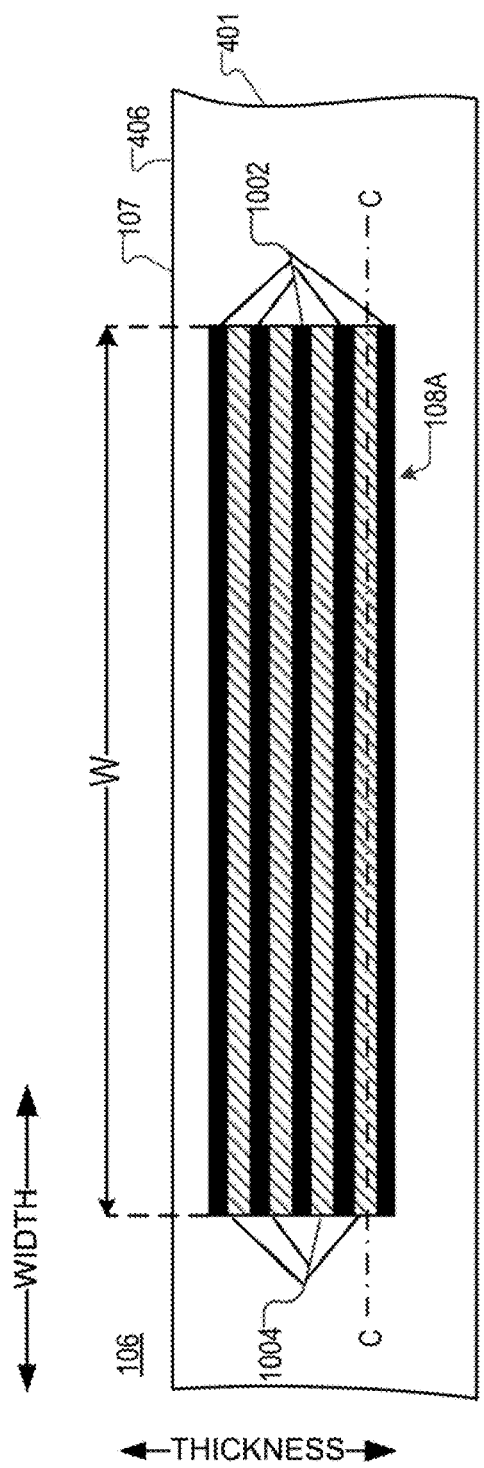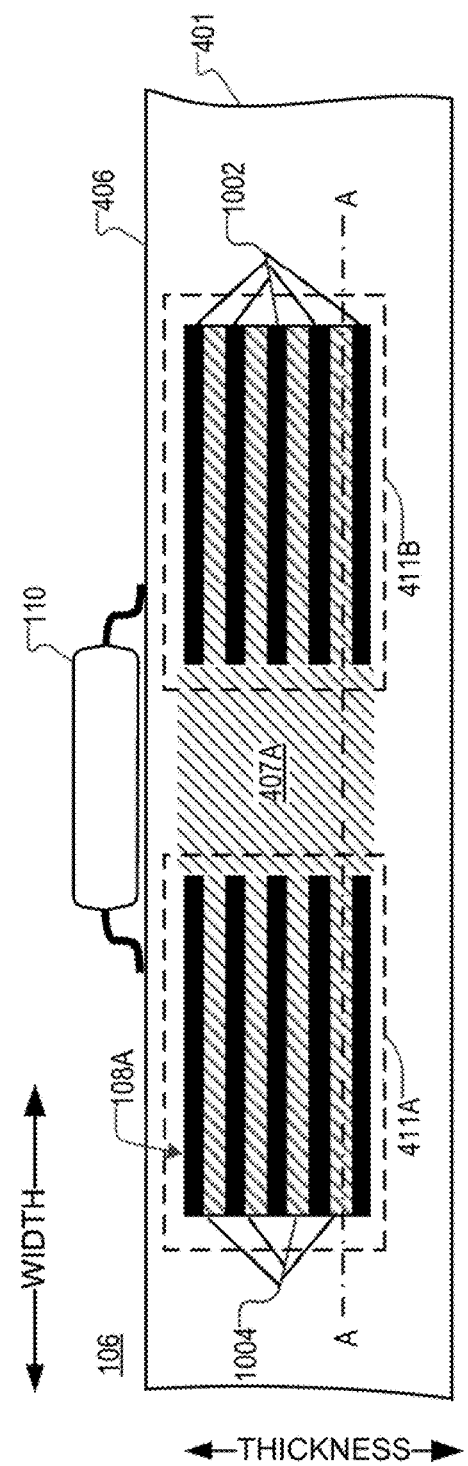
FIG. 10A
FIG. 10B

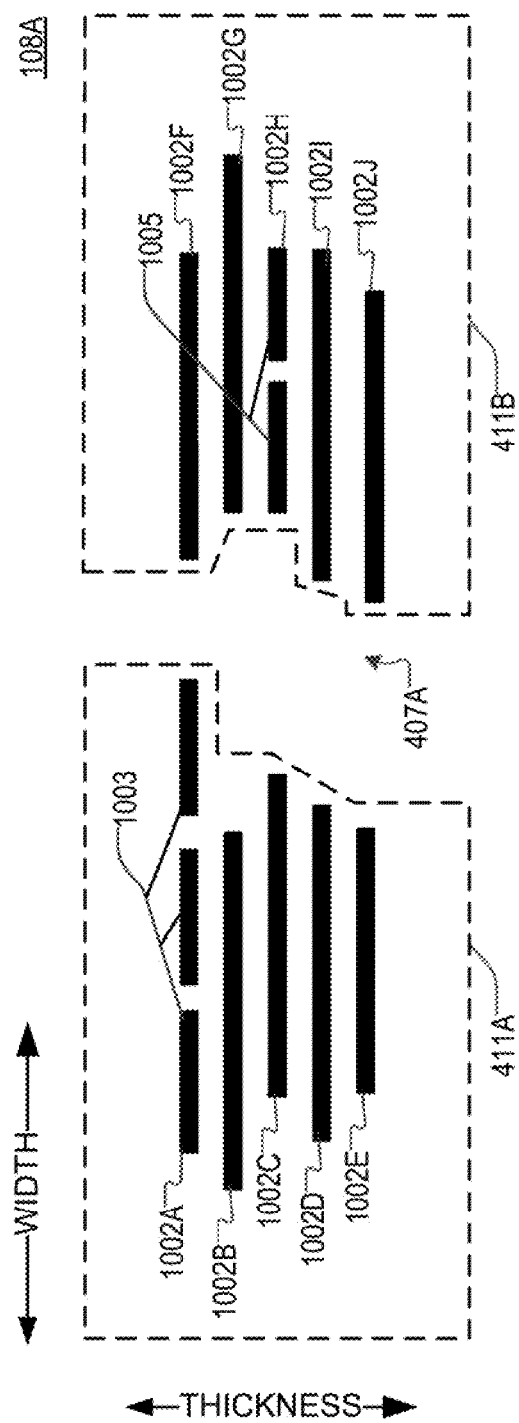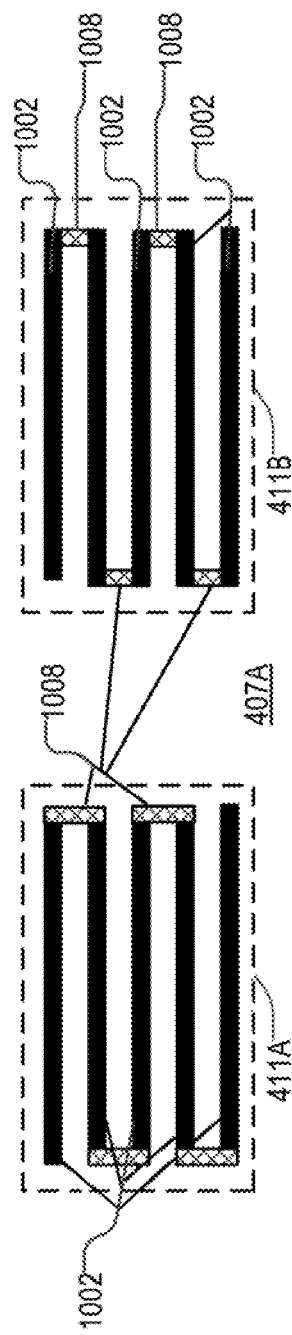
FIG. 10C
FIG. 10D

ID: 11,656,250 B2

CURRENT SENSOR SYSTEM

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a current sensor system is provided, comprising: a plurality of conductors that are integrated into a substrate, each of the plurality of conductors having a respective first through-hole formed therein; and a plurality of current sensors, each of the plurality of current sensors being disposed on the substrate, each of the plurality of current sensors being disposed above or below the respective first through-hole of a different one of the plurality of conductors, wherein the substrate includes a plurality of conductive traces, each of the plurality of conductive traces being coupled to at least one of the plurality of current sensors.

A current sensor system is provided, comprising: a plurality of conductors, each of the plurality of conductors having a respective notched portion and a respective first through-hole formed in the respective notched portion; and a plurality of current sensors, each of the plurality of current sensors being disposed on above or below the respective first through-hole of a different one of the plurality of conductors.

According to aspects of the disclosure, a method is provided for determining current in one or more of a plurality of conductors, the method comprising: providing a substrate including a plurality of conductors, each of the plurality of conductors having a respective first through-hole formed therein; and providing a plurality of current sensors on the substrate, each of the plurality of current sensors being provided above or below the respective first through-hole of a different one of the plurality of conductors.

BRIEF DESCRIPTION OF THE DRAWINGS

The foregoing features may be more fully understood from the following description of the drawings in which:

FIG. 10A is a diagram of an example of a conductor, according to aspects of the disclosure;

FIG. 10B is a diagram illustrating the use of the conductor of FIG. 10A, according to aspects of the disclosure;

FIG. 10C is a diagram illustrating an alternative configuration of the conductor of FIG. 10A, according to aspects of the disclosure; and FIG. 10D is a diagram illustrating an alternative configuration of the conductor of FIG. 10A, according to aspects of the disclosure.

DETAILED DESCRIPTION

Figure 1:
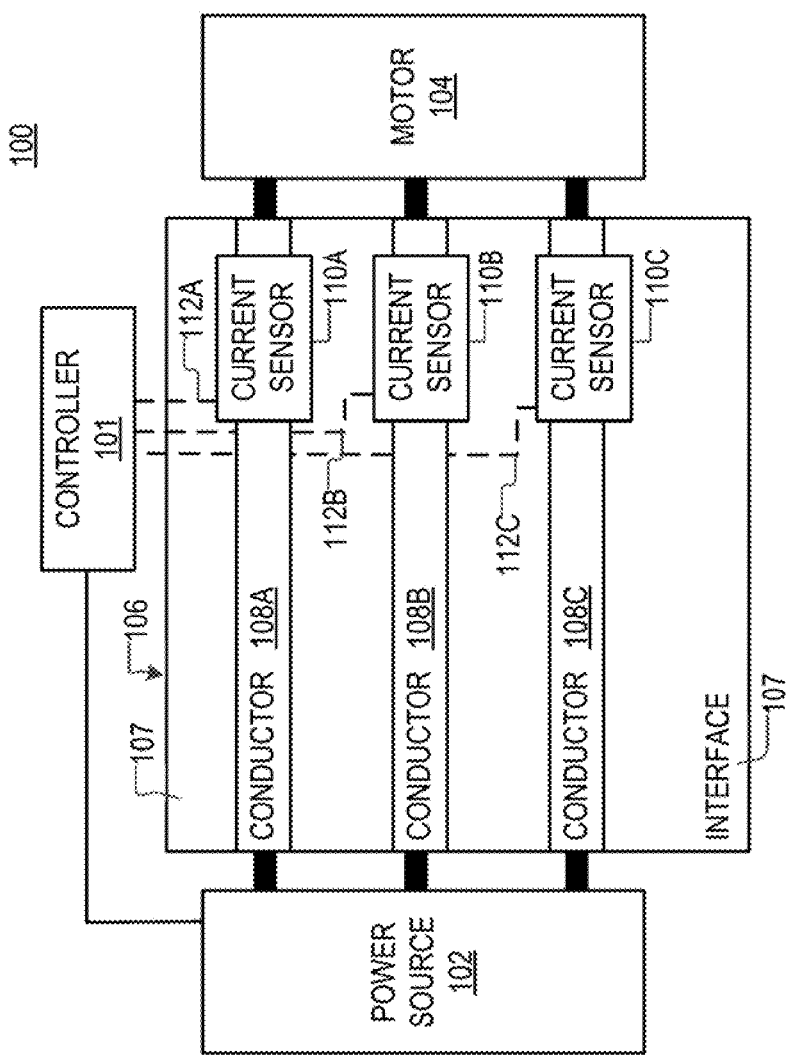
FIG. 1 is a diagram of an example of a system, according to aspects of the disclosure.

FIG. 1 is a diagram of an example of a system 100, according to aspects of the disclosure. As illustrated, the system 100 may include a controller 101 and a power source 102 that is coupled to an electric motor 104 via an interface 106.

The interface 106 may include a printed circuit board (PCB) 107. The PCB 107 may include conductors 108A-C and conductive traces 112A-C. Each of the conductive traces 112A-C may include one or more metal layers (or layers of another conductive material) that are at least partially encapsulated in a dielectric material of the PCB 107. Each of the conductors 108A-C may also include one or more metal layers (or layers of another conductive material) that are at least partially encapsulated in the dielectric material of the PCB 107. In some implementations, the conductive traces 112A-C may differ in one or more characteristics from the conductors 108A-C. According to the example of FIG. 1, each of the conductors 108A-C may be configured to carry higher currents than any of the conductive traces 112-C. Additionally or alternatively, in some implementations, each of the conductors 108A-C may have a larger cross-section than any of the conductive traces 112-C. Additionally or alternatively, in some implementations, each of the conductors 108A-C may have larger width and/or thickness than any of the conductive traces 112-C.

Each of the conductors 108A-C may be used to deliver, to the electric motor 104, current that is supplied by the power source 102. The controller 101 may be coupled to the current sensors 110A-C via the conductive traces 112A-C. The controller 101 may use the current sensors 110A-C to measure the level of the current that is being supplied by the power source 102 to the electric motor 104 and make adjustments to the operation of the power source 102 and/or the electric motor 104 in response to the measurements. Specifically, the controller 101 may use current sensor 110A to measure the current carried by conductor 108A, current sensor 110B to measure current carried by conductor 108B, and current sensor 110C to measure current carried by conductor 108C. Although in the example of FIG. 1 the interface 106 consists of three conductors 108, alternative implementations are possible in which the interface 106 consists of any number of conductors 108 (e.g., only one conductor, only two conductors, five conductors, etc.). Although in the example of FIG. 1 the interface 106 is used to electrically couple a motor to a power source, it will be understood that the present disclosure is not limited to any specific application of the interface 106.

In some implementations, any of conductors 108A-C may have a width between 8 mm and 30 mm, whereas each of the conductive traces 112A-C may have a width between 0.1 mm and 1 mm. Moreover, each of the conductors 108A-C may include one or more layers (e.g. 1-10 layers, etc.), each having thickness between 20 µm to 200 µm. As can be readily appreciated that conductors 108A-C may be adapted to carry much higher currents than the conductive traces 112A-C. By way of example, in some implementations, each of conductors 108A-C may be configured to carry current in the range of 50-500 A, whereas each of the conductive traces may be configured to carry current in the range of 0.01 A-5 A. As noted above, in some implementations, the conductors 108A-C and the conductive traces 112A-C may be embedded in the PCB 107. In some implementations, both the conductors 110A-C and the conductive traces 112A-C may be formed by using standard lithographic techniques that are normally applied in PCB manufacturing.

Figure 2:
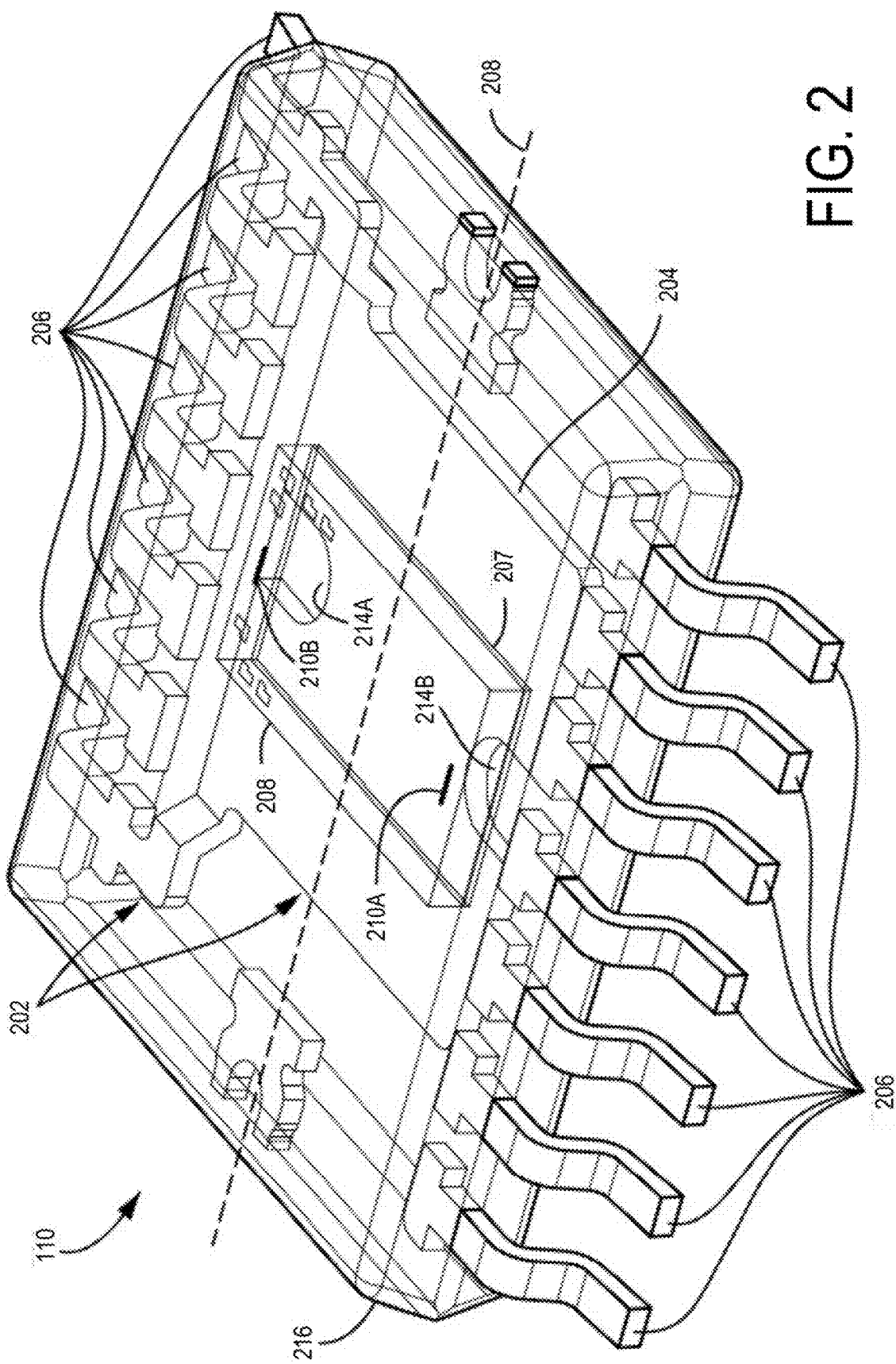
FIG. 2 is a diagram of an example of a current sensor, according to aspects of the disclosure.

FIG. 2 is a diagram of an example of a current sensor 110, according to aspects of the disclosure. As the numbering suggests, the current sensor 110 may be the same or similar to any of the current sensors 110A-C, which are shown in FIG. 1. It will be understood that FIG. 2 is provided as an example only, and the interface 106 is not limited to using any specific type of current sensor.

Features of current sensor 110 include a lead frame 202 and a die 208 supporting magnetic field sensing elements 210A and 210B. Lead frame 202 includes a die attach paddle 204 and a plurality of leads 206. Die 208 is attached to die attach paddle 204, as may be achieved with an adhesive layer 207. While a single semiconductor die 208 is shown, the current sensor 110 can include more than one die, with each such die supporting magnetic field sensing element(s) and/or supporting circuitry. Additional features of the example current sensor 110 can include one or more cutouts, slits, slots or apertures 214A, 214B in the paddle 204 to reduce eddy currents and mold material 216 to enclose die attach paddle 204, die 208, magnetic field sensing elements 210A and 210B and portions of leads 206, shown. Aspects of current sensor 110 are shown and described in U.S. Pat. No. 10,481,181, entitled "Systems and Methods For Current Sensing" and issued on Nov. 19, 2019, which patent is hereby incorporated herein by reference in its entirety. In use, current sensor 110 is configured to be positioned proximate to a conductor, such as any of the conductors 108A-C, which are shown in the configuration of FIG. 1. Although in the example of FIG. 2, the sensor 110 includes two magnetic field sensing elements, alternative implementations are possible in which the sensor 110 includes only one magnetic field sensing element or more than two magnetic field sensing elements.

Figure 3:
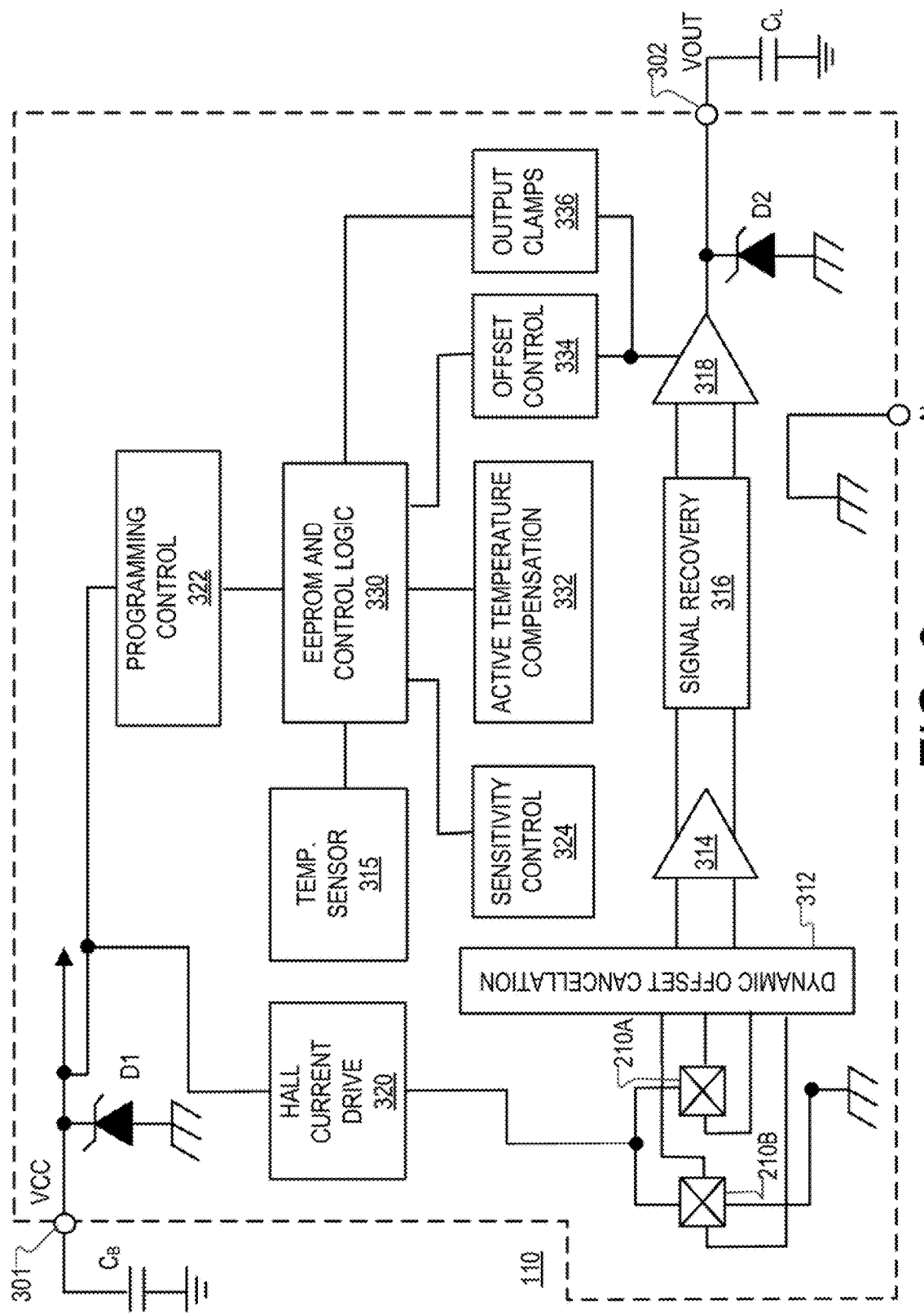
FIG. 3 is a diagram of an example of a current sensor, according to aspects of the disclosure.

FIG. 3 is a circuit diagram illustrating one possible implementation of the electronic circuitry of the sensor 110.

The sensor 110 may be configured to output a signal VOUT that is proportional to $\Delta B = B_R - B_L$ where $B_R$ represents magnetic field incident on one of the magnetic field sensing elements 210A-B and $B_L$ represents magnetic field incident on the other one of the magnetic field sensing elements 210A-B. The sensor output VOUT is also affected by the sensitivity, $\alpha$, of the signal path and can be represented as follows:

$$VOUT = \alpha \times \Delta B \quad (1)$$

The relationship between the conductor current to be measured and the differential field $\Delta B$ can be represented by a coupling coefficient, $K(71)$ as follows:

$$\Delta B = K(f) \times I \quad (2)$$

It will be appreciated that coupling coefficient $K(f)$ corresponds to coupling (e.g., transfer of energy, etc.) between a given current sensor and varies with frequency. As is discussed further below, the design of the conductors 108A-C helps reduce the variation of the coupling coefficient $K(f)$ with respect to the frequency of the current that is being transmitted over conductors 108A-C.

The sensor 110 may include a VCC (supply voltage) pin 301, a VOUT (output signal) pin 302. The VCC pin 301 is used for the input power supply or supply voltage for the current sensor 110. A bypass capacitor, CB, can be coupled between the VCC pin 301 and ground. The VCC pin 301 can also be used for programming the current sensor 110. The VOUT pin 302 is used for providing the output signal VOUT to circuits and systems (not shown) such as controller 101 (FIG. 1) and can also be used for programming. An output load capacitance CL is coupled between the VOUT pin 302 and ground. The example current sensor 110 can include a first diode D1 coupled between the VCC pin 301 and chassis ground and a second diode D2 coupled between the VOUT pin 302 and chassis ground.

The driver circuit 320 may be configured to drive the magnetic field sensing elements 210A and 210B. Magnetic field signals generated by the magnetic field sensing elements 210A and 210B are coupled to a dynamic offset cancellation circuit 312, which is further coupled to an amplifier 314. The amplifier 314 is configured to generate an amplified signal for coupling to the signal recovery circuit 316. Dynamic offset cancellation circuit 312 may take various forms including chopping circuitry and may function in conjunction with offset control circuit 334 to remove offset that can be associated with the magnetic field sensing elements 210A-B and/or the amplifier 314. For example, offset cancellation circuit 312 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 110 to regulate the supply voltage.

A programming control circuit 322 is coupled between the VCC pin 301 and EEPROM and control logic circuit 330 to provide appropriate control to the EEPROM and control logic circuit. EEPROM and control logic circuit 330 determines any application-specific coding and can be erased and reprogrammed using a pulsed voltage. A sensitivity control circuit 324 can be coupled to the amplifier 314 to generate and provide a sensitivity control signal to the amplifier 314 to adjust a sensitivity and/or operating voltage of the amplifier 314. An active temperature compensation circuit 332 can be coupled to sensitivity control circuit 324, EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via a temperature sensor 315 and perform necessary calculations to compensate for changes in temperature, if needed. Output clamps circuit 336 can be coupled between the EEPROM and control logic circuit 330 and the driver circuit 318 to limit the output voltage and for diagnostic purposes.

Figure 4:
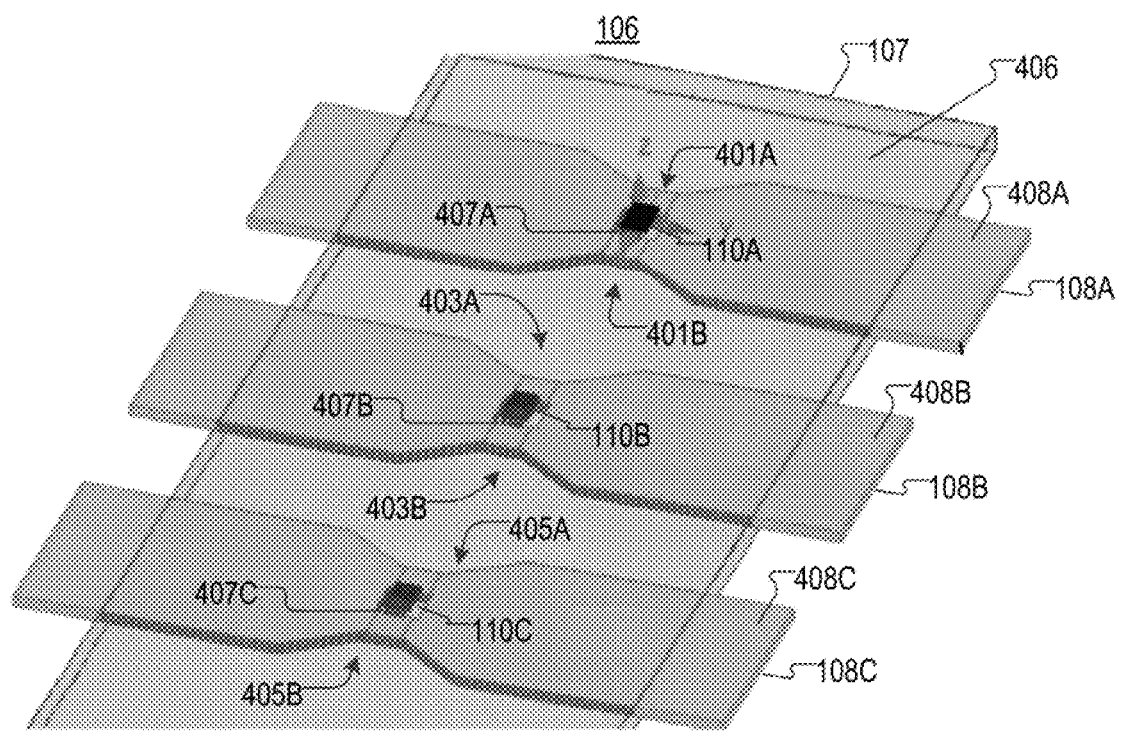
FIG. 4 is a perspective view of an example of a system, according to aspects of the disclosure.

FIG. 4 is a perspective view of the interface 106, according to aspects of the disclosure. As illustrated, the conductor 108A may include a through-hole 407A formed therein, and the current sensor 110A may be disposed above or below the through-hole. The sensor 110A may be mounted on the PCB 107 and the leads 206 of the sensor 110A may be electrically coupled to the conductive traces 112A. A notch 401A may be formed in the conductor 108A on one side of the through-hole 407A. And a notch 401B may be formed in the conductor 108A on the other side of the through-hole 407A. In some implementations, notches 401A-B may be altogether omitted from the conductor 108A.

The conductor 108B may include a through-hole 407B formed therein, and the current sensor 110B may be disposed above or below the through-hole, as shown. The sensor 110B may be mounted on the PCB 107 and the leads 206 of the sensor 110B may be electrically coupled to the conductive traces 112B. A notch 403A may be formed in the conductor 108B on one side of the through-hole 407B. And a notch 403B may be formed in the conductor 108B on the other side of the through-hole 407B. In some implementations, notches 403A-B may be altogether omitted from the conductor 108B.

The conductor 108C may include a through-hole 407C formed therein, and the current sensor 110C may be disposed above or below the through the hole, as shown. The sensor 110C may be mounted on the PCB 107 and the leads 206 of the sensor 110C may be electrically coupled to the conductive traces 112C. A notch 405A may be formed in the conductor 108C on one side of the through-hole 407C. And a notch 405B may be formed in the conductor 108C on the other side of the through-hole 407C. In some implementations, notches 405A-B may be altogether omitted from the conductor 108C.

The PCB 107 may have a main surface 406. The conductor 108A may have a main surface 408A that is substantially parallel to the main surface 406 of the PCB 107. The conductor 108B may have a main surface 408B that is substantially parallel to the main surface 406 of the PCB 107. And the conductor 108C may also have a main surface 408C that is substantially parallel to the main surface 406 of the PCB 107.

Figure 5A:
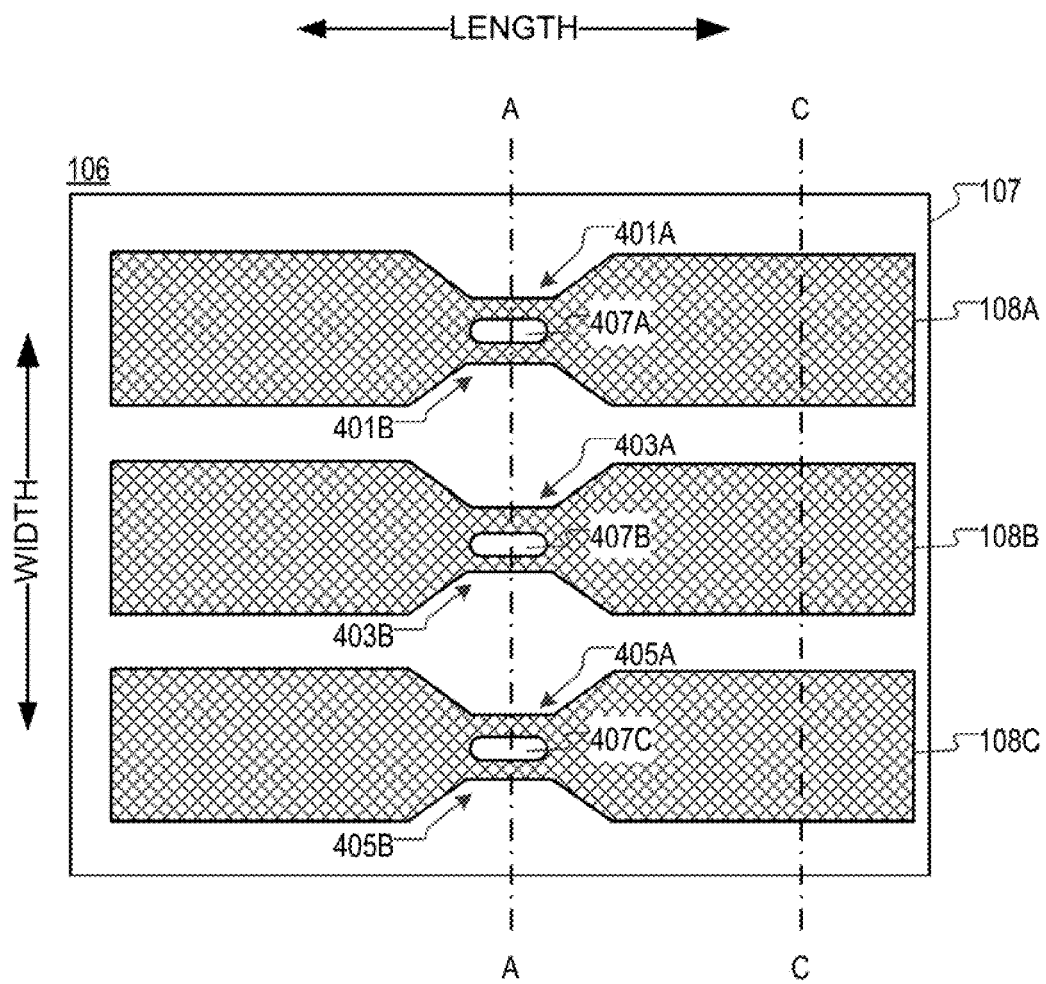
FIG. 5A is a planar view of the system of FIG. 4, according to aspects of the disclosure.

FIG. 5A is a planar top-down view of the interface 106, with the sensors 110A-C removed. In the example of FIG. 5A, each of the through-holes 407A-C is centered on an axis A-A. However, alternative implementations are possible in which one or more of the through-holes 407A-C are offset from axis A-A. For instance, one of the through-holes 407A-C may be situated to the left of axis A-A and another one of the through-holes 407A-C may be situated to the right of axis A-A.

In the example of FIG. 5A, each of the notches 401A-B is centered on axis A-A. However, alternative implementations are possible in which one or more of the notches 401A-B are offset from axis A-A to accommodate the placement of additional hardware on the PCB 107. For instance, one of the notches 401A-B may be formed to the left of axis A-A and the other one of the notches 401A-B may be formed to the right of axis A-A. In the example of FIG. 5A, notch 401A has the same size and shape as notch 401B. However, alternative implementations are possible in which notch 401A has a different size and/or shape than notch 401B.

In the example of FIG. 5A, each of the notches 403A-B is centered on axis A-A. However, alternative implementations are possible in which one or more of the notches 403A-B are offset from axis A-A to accommodate the placement of additional hardware on the PCB 107. For instance, one of the notches 403A-B may be formed to the left of axis A-A and the other one of the notches 403A-B may be formed to the right of axis A-A. In the example of FIG. 5A, notch 403A has the same size and shape as notch 403B. However, alternative implementations are possible in which notch 403A has a different size and/or shape than notch 403B.

In the example of FIG. 5A, each of the notches 405A-B is centered on axis A-A. However, alternative implementations are possible in which one or more of the notches 405A-B are offset from axis A-A to accommodate the placement of additional hardware on the PCB 107. For instance, one of the notches 405A-B may be formed to the left of axis A-A and the other one of the notches 405A-B may be formed to the right of axis A-A. In the example of FIG. 5A, notch 405A has the same size and shape as notch 405B. However, alternative implementations are possible in which notch 405A has a different size and/or shape than notch 405B. In some implementations providing the notches 401-405 on the conductors 108A-C, respectively, may help reduce cross-talk interference between neighboring ones of the conductors 108A-C. Cross talk between two neighboring conductors 108 may occur when the sensor 110 that is mounted over one of the conductors 108 senses a magnetic field that is generated by the other conductor 108.

Figure 5B:
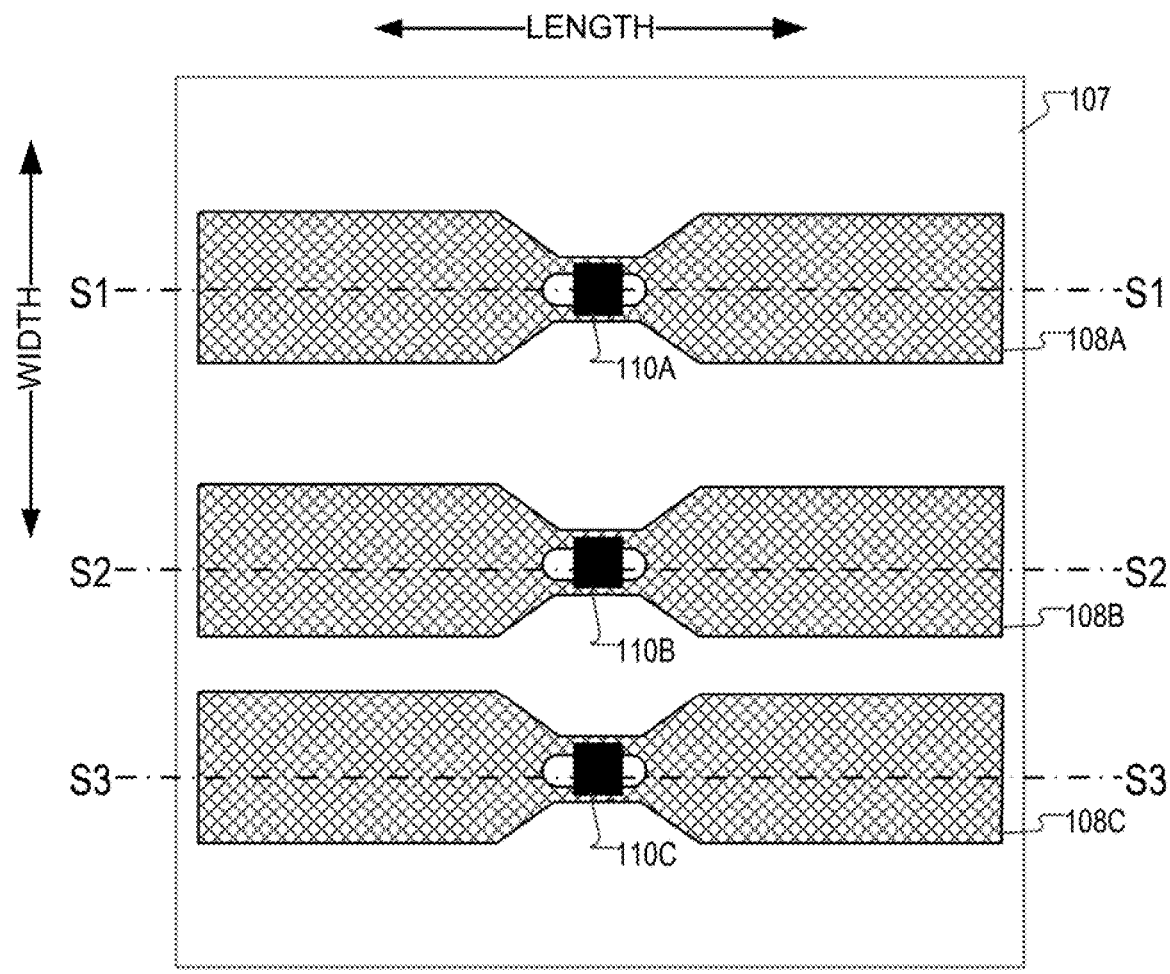
FIG. 5B is a planar view of the system of FIG. 4, according to aspects of the disclosure.

FIG. 5B is a planar top-down view of the interface 106, with the sensors 110A-C present. As illustrated in FIG. 5B, the sensor 110A may have an axis of maximum sensitivity S1-S1 that is substantially perpendicular to the length and width of the conductor 108A. The sensor 110B may have an axis of maximum sensitivity S2-S2 that is substantially perpendicular to length and width of the conductor 108B. The sensor 110C may have an axis of maximum sensitivity S3-S3 that is substantially perpendicular to length and width of the conductor 108C. The phrase "substantially perpendicular" as used throughout the disclosure shall mean "within 5 degrees of being perpendicular." It will be understood that the present disclosure is not limited to any specific orientation of the axis of maximum sensitivity of any of the sensors 110A-C for as long as the sensor is able to sense the level of the current flowing through its respective conductor 108.

Figure 5C:
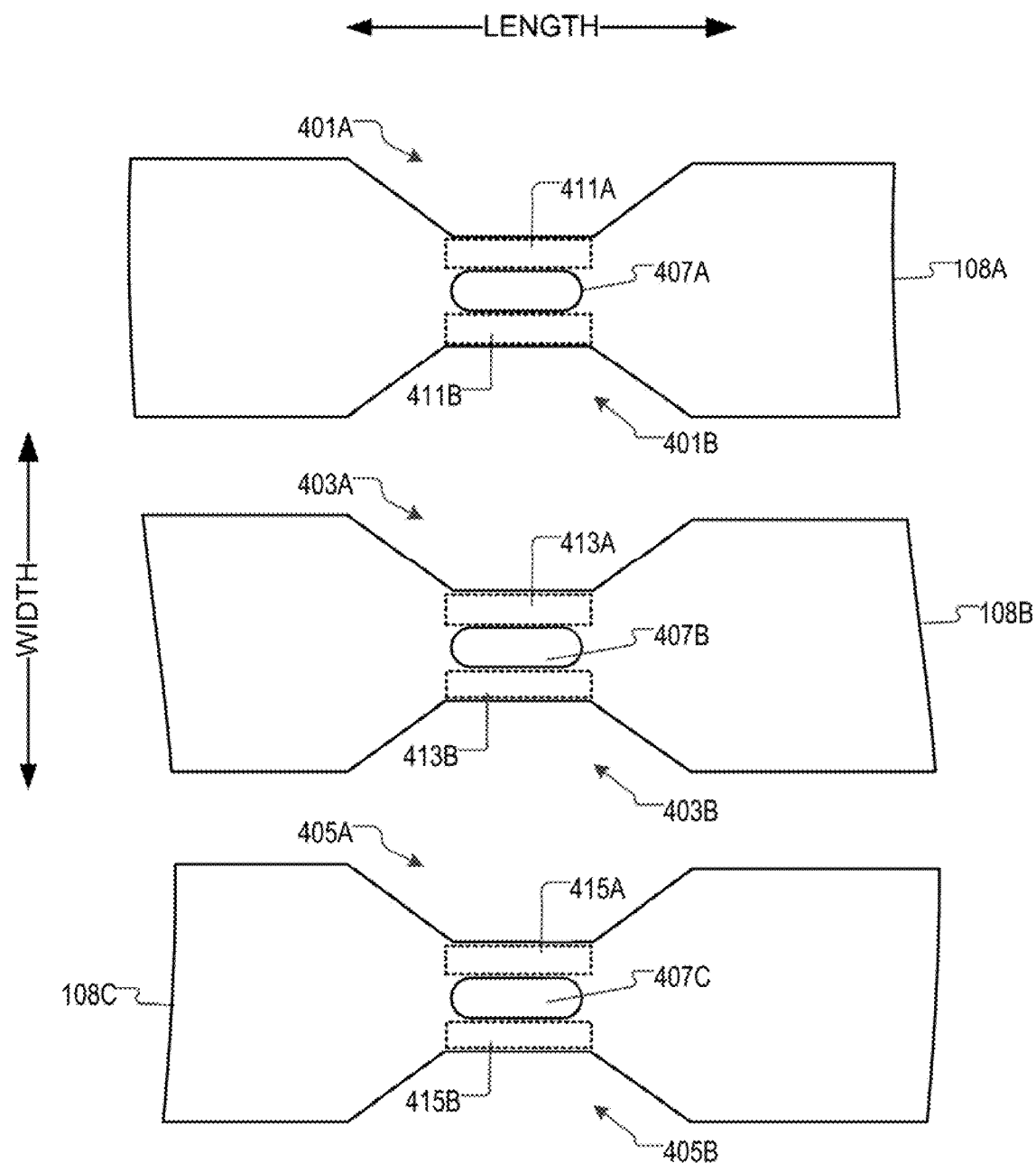
FIG. 5C is a planar view of a portion the system of FIG. 4, according to aspects of the disclosure.

FIG. 5C is a partial planar top-down view of the conductors 108A-C, according to aspects of the disclosure. As illustrated in FIG. 5C, through-hole 407A (and optionally the notches 401A-B) may define legs 411A and 411B in the conductor 108A. Legs 411A-B are denoted by dashed rectangles in FIG. 5C. Legs 411A and 411B, according to the present example, have the same width. However, alternative implementations are possible in which leg 411A has a different width than leg 411B. The distance between legs 411A and 411B may be selected, such that it is large enough to avoid the creation of eddy currents between the legs 411A and 411B, while ensuring that the coupling coefficient K(f) between the legs 411A-B and the sensor 110 is large enough to meet the specification of the sensor 110A for reliable operation. In some respects, decreasing the width of the conductor 108A by forming legs 411A-B may help reduce the variability of the coupling coefficient K(f) with respect to the frequency of the current that is carried over the conductor 108A.

Through-hole 407B (and optionally the notches 403A-B) may define legs 413A and 413B in the conductor 108B. Legs 413A-B are denoted by dashed rectangles in FIG. 5C. Legs 413A and 413B, according to the present example, have the same width. However, alternative implementations are possible in which leg 413A has a different width than leg 413B. The distance between legs 413A and 413B may be selected, such that it is large enough to avoid the creation of eddy currents between the legs 413A and 413B, while ensuring that the coupling factor K(f) between the legs 413A-B and the sensor 110B is large enough to meet the specification of the sensor 110B for reliable operation. In some respects, decreasing the width of the conductor 108B by forming legs 413A-B may help reduce the variability of the coupling coefficient K(f) with respect to the frequency of the current that is carried over the conductor 108B.

Through-hole 407C (and optionally the notches 405A-B) may define legs 415A and 415B in the conductor 108C. Legs 415A-B are denoted by dashed rectangles in FIG. 5C. Legs 415A and 415B, according to the present example, have the same width. However, alternative implementations are possible in which leg 415A has a different width than leg 415B. The distance between legs 415A and 415B may be selected, such that it is large enough to avoid the creation of eddy currents between the legs, while ensuring that the coupling factor K(f) between legs 415A-B and the sensor 110C is large enough to meet the specification of the sensor 110C for reliable operation. In some respects, decreasing the width of the conductor 108C by forming legs 415A-B may help reduce the variability of the coupling coefficient K(f) with respect to the frequency of the current that is carried over the conductor 108C.

In some respects, the increase in resistance of the conductor 108A-C, which results from reducing the width of the conductors 108A-C (at legs 411-415 respectively) may be calculated by using Equation 3 below:

$$\Delta R = \left(\frac{\rho}{T}\right)\left(\frac{Ls}{WT} + 2\frac{NL - Ls}{W + S + WT} - \frac{NL}{W}\right). \quad (3)$$

Figure 5D:
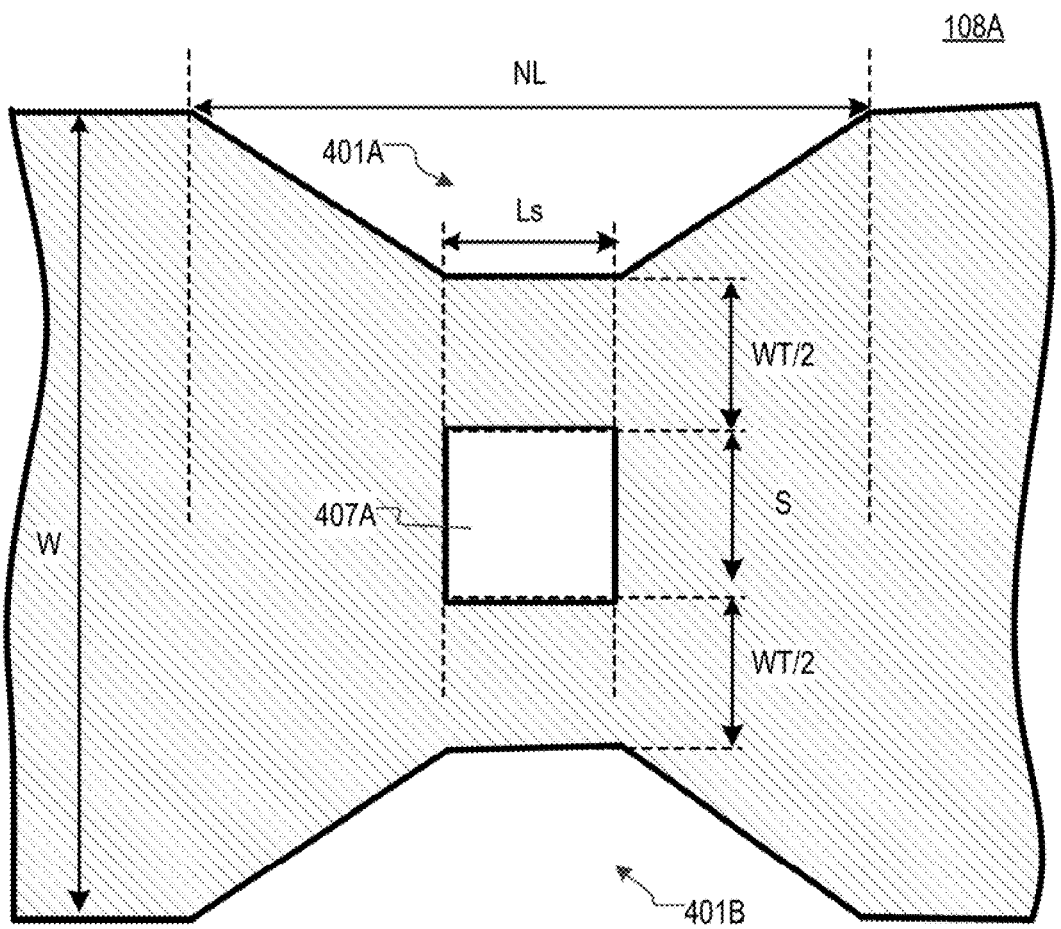
FIG. 5D is a partial view of a conductor, according to aspects of the disclosure.

Dimensions W, S, Ls, NL, WT are shown in FIG. 5D. In addition, T is the thickness of any of conductors 108A-C. In implementations in which a conductor 108 includes multiple layers, the thickness of the conductor 108 may be equal to the sum of the thicknesses of the conductor's constituent layers. The thickness of each 108A-C may be a dimension that is perpendicular to both of dimensions NL and W. Although FIG. 5D shows a partial view of conduction 108A, it will be understood that conductors 108B and 108C may have a similar configuration. In one example ρ=2e-8∩m. Additionally or alternatively, in some implementations, dimensions W, T, S, Ls, NL, WT may have the following values: W=25 mm, T=0.5 mm, S=5 mm, Ls=5 mm, NL=20 mm, and WT=9 mm. In some respects, Equation 3 illustrates that introducing a respective through-hole in each of the conductors 108A-C to form two separate legs results in a smaller increase in resistance of the conductors 108A-C in comparison to similar techniques that rely solely on notching.

Figure 6A:
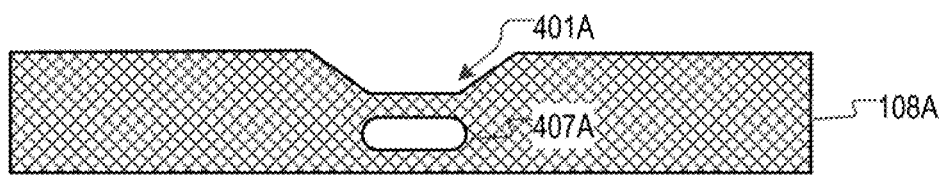
FIG. 6A is a diagram of an example of a conductor, according to aspects of the disclosure.
Figure 6B:
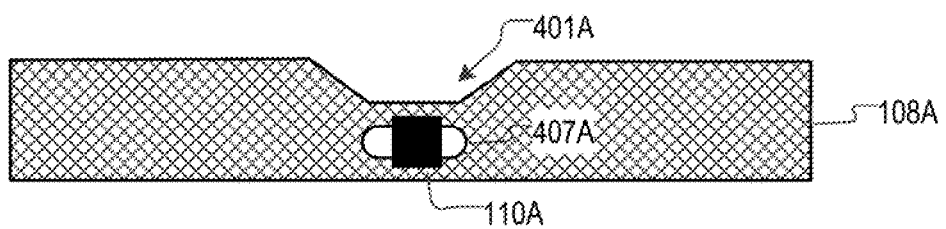
FIG. 6B is a diagram illustrating the use of the conductor of FIG. 6A, according to aspects of the disclosure.

FIGS. 6A-B illustrate an example of the conductor 108A, in accordance with an alternative implementation. FIGS. 6A-B illustrate that in some implementations, the conductor 108A may include only one notch (e.g., notch 401). Although FIGS. 6A-B show the conductor 108A only, it will be understood that in some implementations, any or all of conductors 108B-C may have the same configuration.

Figure 7A:
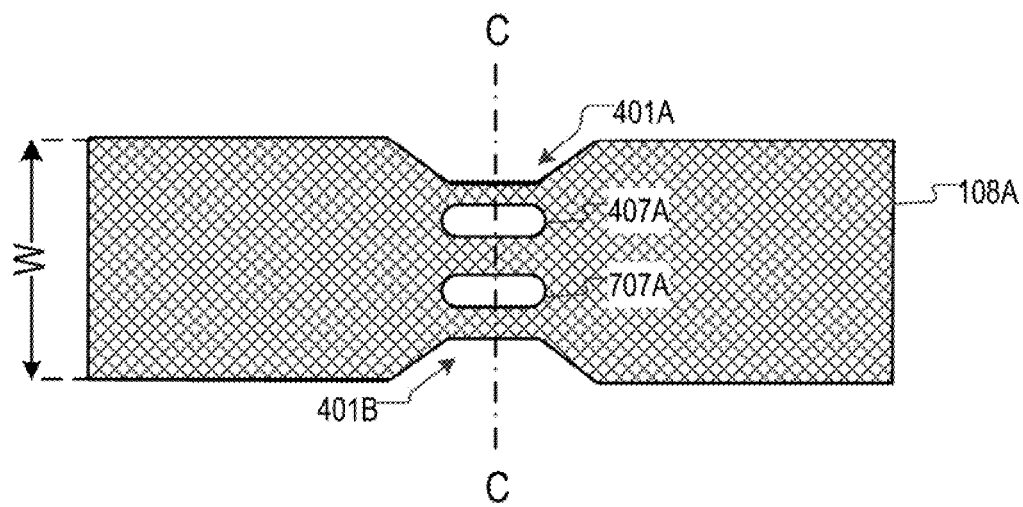
FIG. 7A is a diagram of an example of a conductor, according to aspects of the disclosure.
Figure 7B:
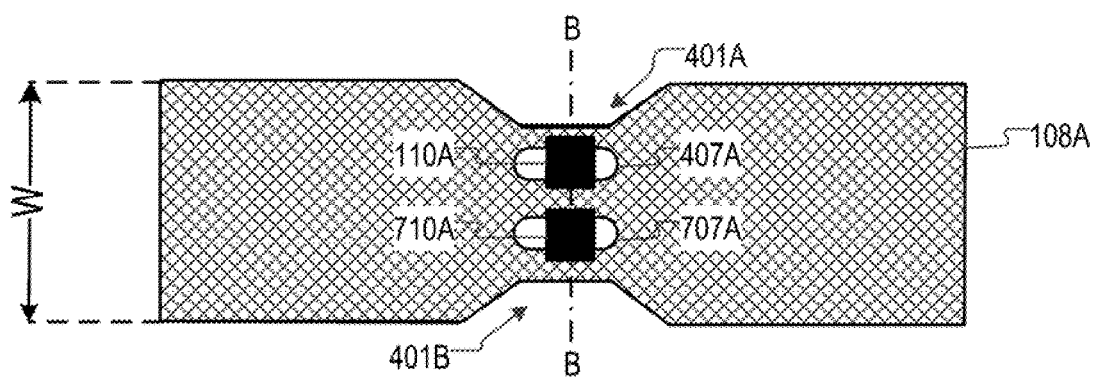
FIG. 7B is a diagram illustrating the use of the conductor of FIG. 7A, according to aspects of the disclosure.

FIGS. 7A-B illustrate an example of the conductor 108A, in accordance with an alternative implementation. FIGS. 7A-B illustrate that in some implementations the conductor 108A may be provided with an additional through-hole 707A, as well as an additional sensor 710A that is mounted over the through-hole 707A. The sensor 710A may be the same or similar to the sensor 110A. In some implementations, the sensor 710A may have a function that is redundant to that of the sensor 110A and it may be provided to increase the reliability of the interface 106. For instance, the sensor 710A may be provided to achieve a higher Automotive Safety Integrity Level (ASIL) rating of the interface 106. According to the example of FIGS. 7A-B, the through-holes 407A and 707A are centered on an axis B-B, which extends along the width W of the conductor 108A. However, alternative implementations are possible in which at least one of the through-holes 407A and 707B is offset from the axis B-B. For instance, through-hole 407A may be formed to the left of axis B-B and through-hole 707A may be formed to the right of axis B-B. According to the example of FIGS. 7A-B, through-holes 407A and 707A are the same size and shape. However, alternative implementations are possible in which the through-holes 407A and 707A have different shapes and/or sizes. Although FIGS. 7A-B show the conductor 108A only, it will be understood that in some implementations, any or all of conductors 108B-C may have the same configuration.

Figure 8A:
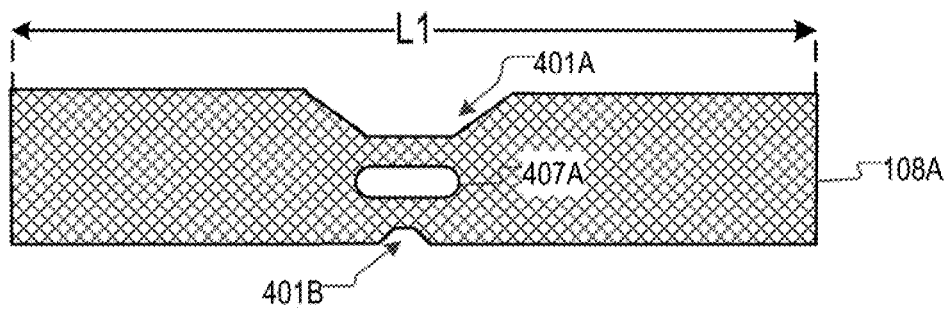
FIG. 8A is a diagram of an example of a conductor, according to aspects of the disclosure.
Figure 8B:
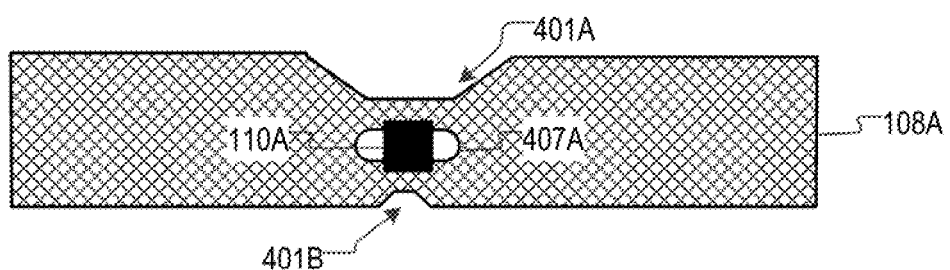
FIG. 8B is a diagram illustrating the use of the conductor of FIG. 8A, according to aspects of the disclosure.

FIGS. 8A-B illustrate an example of the conductor 108A, in accordance with an alternative implementation. FIGS. 8A-B illustrate that in some implementations, the notches 401A and 401B of the conductor 108A may have different shapes and sizes. Although FIGS. 8A-B show the conductor 108A only, it will be understood that in some implementations, any or all of conductors 108B-C may have the same configuration.

Figure 9A:
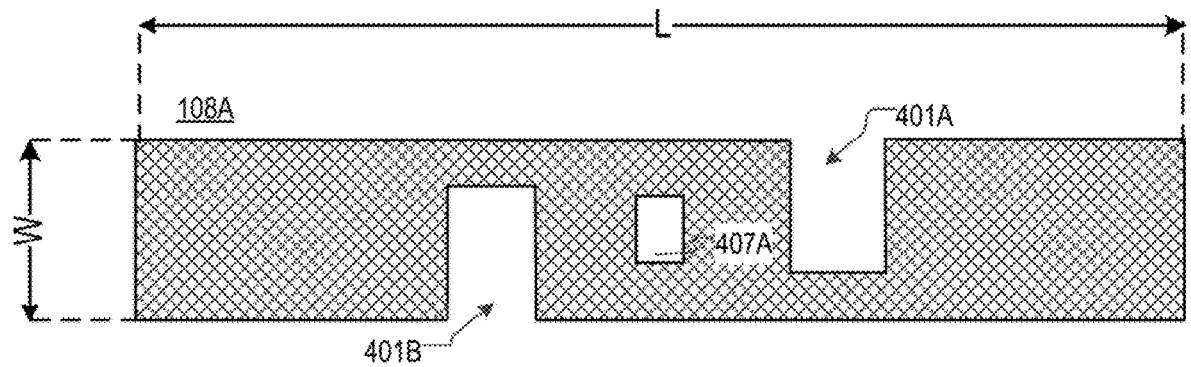
FIG. 9A is a diagram of an example of a conductor, according to aspects of the disclosure.
Figure 9B:
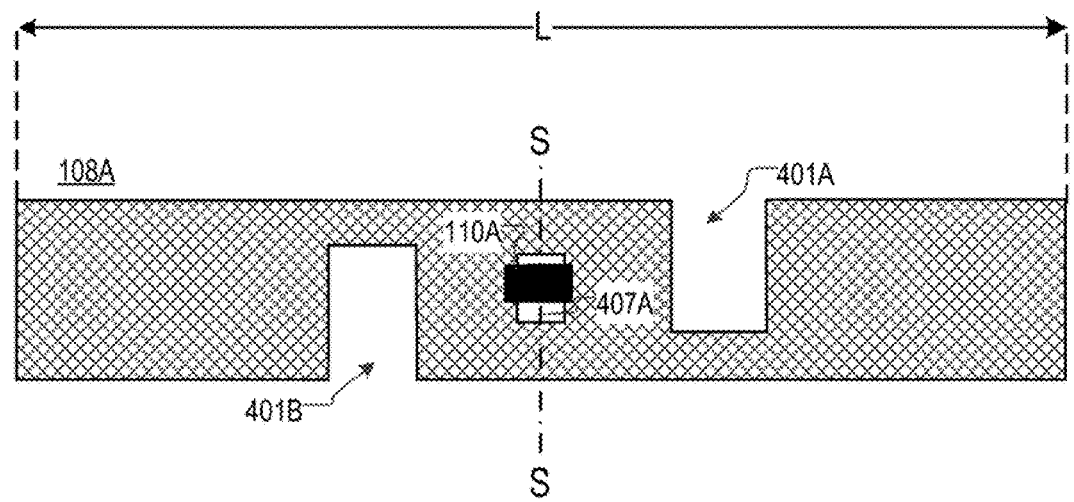
FIG. 9B is a diagram illustrating the use of the conductor of FIG. 9A, according to aspects of the disclosure.

FIGS. 9A-B illustrate an example of the conductor 108A, in accordance with an alternative implementation. FIGS. 9A-B illustrate that in some implementations, the notches 401A and 401B of the conductor 108A may be spaced apart from one another along the length L of the conductor 108A. This is in contrast to the preceding examples, in which the notches 401A-B are spaced apart from one another along the width of the conductor 108A. Although FIGS. 9A-B show the conductor 108A only, it will be understood that in some implementations, any or all of conductors 108B-C may have the same configuration. In the example of FIGS. 9A-B, the sensor 110A may have an axis of maximum sensitivity that is perpendicular (or otherwise transverse) to the length L and width W of the conductor 108A. The configuration shown in FIGS. 9A-B may prevent the sensor 110A from sensing magnetic field(s) generated by neighboring conductor(s). In other words, arranging the sensor 110A in the manner shown in FIGS. 9A-B may help reduce crosstalk between the sensor 110A and neighboring conductors (e.g., the conductors 110B-C, etc.). It will be understood that the present disclosure is not limited to any specific orientation of the axis of maximum sensitivity of the sensors 110A for as long as the sensor is able to sense the level of the current flowing through conductor 108A.

FIG. 10A is a cross-sectional side view of the interface 106 that is taken along axis C-C (shown in FIG. 5A). Depicted in FIG. 10A is the structure of the conductor 108A in accordance with one particular implementation. In this implementation, the conductor 108A includes a plurality of metal layers 1002 that are separated from each other by layers of dielectric material 1004. Each of the metal layers 1002 may have the same width W as the rest of the metal layers 1002. However, alternative implementations are possible in which at least two of the metal layers 1002 have different widths. In the example of FIG. 10A, each of the metal layers 1002 has the same thickness. However, alternative implementations are possible in which at least two of the metal layers 1002 have different thicknesses. Furthermore, in the example of FIG. 10A, the metal layers 1002 are situated directly over one another, such that none of the metal layers 1002 overhangs another one of the metal layers 1002. However, alternative implementations are possible in which at least one of the metal layers 1002 overhangs another one of the metal layers 1002. (e.g., see FIG. 10C). Furthermore, in the example of FIG. 10A each of the metal layers 1002 has a main surface that are substantially parallel to the main surface 406 of the PCB 107.

FIG. 10B is a cross-sectional side view of the interface 106 that is taken along axis A-A (shown in FIG. 5A). FIG. 10B illustrates that the through-hole 407A may extend through all metal layers of the conductor 108A. FIG. 10B further illustrates that the through-hole 407A may be filled with a dielectric material.

FIG. 10C shows an example of the conductor 108A, in accordance with an alternative implementation. More particularly, FIG. 10C is a cross-sectional side view of the conductor 108A that is taken along axis A-A (shown in FIG. 5A). In the example of FIG. 10C, leg 411A is formed of metal layers 1002A-E. As illustrated, each of the metal layers 1002A-E may be formed in a different plane. At least some of the metal layers 1002A-E may have a different width and they may overhang one another, as shown. According to the example of FIG. 10C, metal layers 1002B-1002E are integral metal layers and metal layer 1002A is a segmented metal layer. Metal layer 1002A may include a plurality of segments 1003 that are separated from one another by the dielectric material (which is also used to separate the metal layers 1002A-E). Each of the segments 1003 may have a width that is smaller than a width of the metal layer 1002E and/or the width of one or more of the metal layers 1002B-D.

In the example of FIG. 10C, leg 411B is formed of metal layers 1002F-J. As illustrated, each of the metal layers 1002F-J may be formed in a different plane. Each of the metal layers may be formed of a conductive material (e.g., metal). Furthermore, at least some of the metal layers 1002 F-J may have a different width and they may overhang one another, as shown. According to the example of FIG. 10C, metal layers 1002F-G and 1002I-J are integral metal layers and metal layer 1002H is a segmented metal layer. Metal layer 1002H may include a plurality of segments 1005 that are separated from one another by the dielectric material (which is also used to separate the metal layers 1002F-J). Each of the segments 1005 may have a width that is smaller than the width of the metal layer 1002E and/or the width of one or more of the metal layers 1002B-D. In some implementations, the remaining portions of the conductor 108A also have the configuration shown in FIG. 10C. Although FIG. 10C shows the conductor 108A only, it will be understood that in some implementations, any of conductors 108B-C may have the same configuration.

FIG. 10D shows an example of the conductor 108A, in accordance with an alternative implementation. More particularly, FIG. 10D is a cross-sectional side view of the conductor 108A that is taken along axis A-A (shown in FIG. 5A). In the example of FIG. 10D, leg 411A is formed of metal layers 1002 (depicted as solid black rectangles). The metal layers 1002 may be partially separated by layers of dielectric material that are disposed between the metal layers 1002. The metal layers 1002 may be electrically coupled to one another by conductive vias 1008 that are formed in the ends of the metal layers 1002, and which are depicted as cross-hatched rectangles. Leg 411B is similarly formed of metal layers 1002 (depicted as solid black rectangles). The metal layers 1002 may be partially separated by layers of dielectric material that are disposed between the metal layers 1002. The metal layers 1002 may be electrically coupled to one another by conductive vias 1008 that are formed in the ends of the metal layers 1002, and which are depicted as cross-hatched rectangles. In some implementations, the remaining portions of the conductor 108A also have the configuration shown in FIG. 10D. Although FIG. 10D shows the conductor 108A only, it will be understood that in some implementations, any of conductors 108B-C may have the same configuration.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A current sensor system, comprising:
a plurality of conductors that are integrated into a substrate, each of the plurality of conductors including: (i) a respective first notch that is formed on a first side of the conductor and extends towards a second side of the conductor past a middle of the conductor, (ii) a respective sound notch that is formed on a side of the conductor and extends towards the first side past the middle of the conductor, the second notch being spaced apart from the first notch along a length of the conductor, and (iii) a respective through-hole formed in a portion of the conductor that is situated between the respective first notch and the respective second notch; and
a plurality of current sensors, each of the plurality of current sensors being disposed on the substrate, each of the plurality of current sensors being disposed above or below the respective through-hole of a different one of the plurality of conductors,
wherein the substrate includes a plurality of conductive traces, each of the plurality of conductive traces being coupled to at least one of the plurality of current sensors.

2. The current sensor system of claim 1, wherein each of the plurality of conductors includes a respective main surface that is parallel with a main surface of the substrate, and the respective through-hole of each of the plurality of conductors is formed in the respective main surface of the conductor.

3. The current sensor system of claim 1, wherein the respective through-hole of any of the plurality of conductors is formed adjacent to at least one notch in the conductor.

4. The current sensor system of claim 1, wherein each of the plurality of conductors has a width of at least 8 mm.

5. The current sensor system of claim 1, wherein the substrate includes a printed circuit board.

6. A current sensor system, comprising:
a plurality of conductors that are integrated into a substrate, each of the plurality of conductors having a respective through-hole formed therein; and
a plurality of current sensors, each of the plurality of current sensors being disposed on the substrate, each of the plurality of current sensors being disposed above of below the respective through-hole of a different one of the plurality of conductors,
wherein the substrate includes a plurality of conductive traces, each of the plurality of conductive traces being coupled to at least one of the plurality of current sensors,
wherein at least one of the plurality of conductors includes: a plurality of first portions that are formed in a first plane; and a second portion that is formed in a second plane, the second portion being spaced apart from the plurality of first portions by a layer of dielectric material.

7. A current sensor system, comprising:
a plurality of conductors that are integrated into a substrate, each of the plurality of conductors having a respective first through-hole formed therein; and
a plurality of current sensors, each of the plurality of current sensors being disposed of substrate, each of the plurality of current sensors being disposed above or below the respective first through-hole of a different one of the plurality of conductors,
wherein the substrate includes a plurality of conductive traces, each of the plurality of conductive traces being coupled to at least one of the plurality of current sensors,
wherein at least one of the conductors includes a respective second through-hole that is formed adjacent to the respective first through-hole of the conductor, such that the respective first through-hole and the respective second through-hole of the conductor are formed along a width of the conductor, the current sensor system further comprising an additional current sensor that is disposed on the substrate above or below the respective second through-hole of the conductor.

8. A current sensor system, comprising:
a plurality of conductors, each of the plurality of conductors having a respective notched portion and a respective first through-hole formed in the respective notched portion; and
a plurality of current sensors, each of the plurality of current sensors being disposed on above or below the respective first through-hole of a different one of the plurality of conductors,
wherein at least one of the plurality of conductors includes;
a plurality of first portions that are formed in a first place; and
a second portion that is formed in a second plane, the second portion being spaced apart from the plurality of first portions by a layer of dielectric material, the second portion having a width that is greater than a width of at least one of the first portions.

9. The current sensor system of claim 8, wherein the respective notched portion of each of the plurality of conductors is defined by at least one notch in the conductor.

10. The current sensor system of claim 8, wherein the plurality of conductors are integrated into a substrate, and each of the plurality of current sensors is disposed on the substrate and coupled to one or more conductive traces that are formed in the substrate.

11. The current sensor system of claim 8, wherein the plurality of conductors are integrated into a substrate, each of the plurality of conductors includes a respective main surface that is parallel with a main surface of the substrate, and the respective first through-hole of each of the plurality of conductors is formed in the respective main surface of the conductor.

12. The current sensor system of claim 8, wherein each of the plurality of conductors has a width of at least 8 mm.

13. A current sensor system, comprising;
a plurality of conductors, each of the plurality of conductors having a respective notched portion and a respective first through-hole formed in the respective notched portion; and
a plurality of current sensors, each of the plurality of current sensors being disposed on above or below the respective first through-hole of a different one of the plurality of conductors,
wherein: the plurality of conductors includes a first conductor and a second conductor, and the plurality of current sensors includes a first current sensor that is disposed above or below the respective first through-hole of the first conductor and a second current sensor that is disposed above or below the respective first through-hole of the second conductor;
wherein the first current sensor includes two or more magnetic field sensing elements that are aligned with a first axis that is parallel to a length of the first conductor; and
wherein the second current sensor includes two or more magnetic field sensing elements that are aligned with a second axis that is perpendicular to the length of the first conductor.

14. A current sensor system, comprising:
a plurality of conductors, each of the plurality of conductors having a respective notched portion and a respective first through-hole formed in the respective notched portion; and
a plurality of current sensors, each of the plurality of current sensors being disposed on above or below the respective first through-hole of a different one of the plurality of conductors,
wherein at least one of the conductors includes a respective second through-hole that is formed in the respective notched portion of the conductor, the current sensor system further comprising an additional current sensor that is disposed above or below the respective second through-hole of the conductor.

15. A method for determining current in one or more of a plurality of conductors, the method comprising:
providing a substrate including a plurality of conductors, each of the plurality of conductors having a respective first through-hole formed therein; and
providing a plurality of current sensors on the substrate, each of the plurality of current sensors being provided above or below the respective first through-hole of a different one of the plurality of conductors,
wherein at least one of the conductors includes a respective second through-hole that is formed adjacent to the respective first through-hole of the conductor, such that the respective first through-hole and the respective second through-hole of the conductor are formed along a width of the conductor, the method further comprising providing an additional current sensor on the substrate, the additional current sensor being provided above or below the respective second through-hole of the conductor.

16. The method of claim 15, wherein the respective first through-hole of each of the plurality of conductors is formed in a notched portion of the conductor.

17. The method of claim 15, wherein the respective first through-hole of each of the plurality of conductors is formed adjacent to at least one notch in the conductor.

18. The method of claim 15, wherein each of the plurality of conductors has a width of at least 8 mm.

19. The method of claim 15, wherein:
the plurality of conductors includes a first conductor and a second conductor;
the plurality of current sensors includes a first current sensor that is disposed above or below the respective first through-hole of the first conductor and a second current sensor that is disposed above or below the respective first through-hole of the second conductor;
the first current sensor includes two or more magnetic field sensing elements that are aligned with a first axis that is parallel to a length of the first conductor; and
the second current sensor includes two or more magnetic field sensing elements that are aligned with a second axis that is perpendicular to the length of the first conductor.

20. The method of claim 15, wherein at least one of the plurality of conductors includes:
a plurality of first portions that are formed in a first plane; and
a second portion that is formed in a second plane, the second portion being spaced apart from the plurality of first portions by a layer of dielectric material, the second portion having a width that is greater than a width of at least one of the first portions.

* * * * *

UNITED STATES PATENT AND TRADEMARK OFFICE
CERTIFICATE OF CORRECTION

PATENT NO. : 11,656,250 B2
APPLICATION NO. : 17/467713
DATED : May 23, 2023
INVENTOR(S) : Yannick Vuillermet et al.

It is certified that error appears in the above-identified patent and that said Letters Patent is hereby corrected as shown below:

In the Specification

Column 1, Line 7 delete "or magnetic" and replace with --or more magnetic--.

Column 1, Line 66 delete "portion the" and replace with --portion of the--.

Column 2, Line 50 delete "112-C." and replace with --112A-C.--.

Column 2, Line 53 delete "112-C" and replace with --112A-C.--.

Column 2, Line 56 delete "112-C" and replace with --112A-C.--.

Column 3, Lines 22-23 delete "traces may" and replace with --traces 112A-C may--.

Column 3, Lines 27 delete "110A-C" and replace with --108A-C--.

Column 4, Line 9 delete "AB" and replace with --$\Delta B$--.

Column 4, Line 10 delete ", K(71)" and replace with --, K(f)--.

Column 4, Line 23 delete ", CB," and replace with --$C_B$,--.

Column 4, Line 29 delete "CL" and replace with --$C_L$--.

Column 4, Line 47 delete "elements (e." and replace with --elements 210A and 210B (e.--.

Column 6, Line 43 delete "to length" and replace with --to the length--.

Column 6, Line 45 delete "to length" and replace with --to the length--.

Signed and Sealed this
Eighth Day of October, 2024

Katherine Kelly Vidal
*Director of the United States Patent and Trademark Office*

CERTIFICATE OF CORRECTION (continued)
U.S. Pat. No. 11,656,250 B2

Column 7, Line 54 delete "each 108A-C" and replace with --each conductor 108A-C--.

Column 7, Line 56 delete "conduction" and replace with --conductor--.

Column 8, Line 25 delete "707B" and replace with --707A--.

Column 8, Line 65 delete "sensors 110A" and replace with --sensor 110A--.

Column 9, Line 22 delete "are substantially" and replace with --is substantially--.

Column 10, Line 57 delete ", a addition" and replace with --, an addition--.

Column 11, Line 38 delete "sound" and replace with --second--.

Column 11, Line 38 delete "a side" and replace with --the second side--.

Column 12, Line 7 delete "above of" and replace with --above or--.